United States Patent [19]
Menda

[11] Patent Number: 5,247,193
[45] Date of Patent: Sep. 21, 1993

[54] SEMICONDUCTOR INSULATED GATE DEVICE WITH FOUR ELECTRODES

[75] Inventor: Kazunori Menda, Tokyo, Japan

[73] Assignee: Olympus Optical Co., Ltd., Tokyo, Japan

[21] Appl. No.: 827,724

[22] Filed: Jan. 29, 1992

[30] Foreign Application Priority Data

Feb. 1, 1991 [JP] Japan .................................. 3-12260
Sep. 27, 1991 [JP] Japan ................................. 3-249354

[51] Int. Cl.$^5$ .......................................... H01L 31/12
[52] U.S. Cl. ........................................ 257/85; 257/94;
257/192; 257/194; 257/290; 257/462
[58] Field of Search ............... 257/290, 257, 193, 192, 257/194, 462, 84, 85, 83, 94

[56] References Cited

U.S. PATENT DOCUMENTS

| | | | |
|---|---|---|---|
| 4,496,964 | 1/1985 | Tsubovichi et al. | 257/290 X |
| 4,531,743 | 7/1985 | Maserjian | 257/290 |
| 5,101,246 | 3/1992 | Onodera | 257/85 X |
| 5,101,253 | 3/1992 | Mizutani et al. | 257/290 X |

FOREIGN PATENT DOCUMENTS 62-37979 2/1987 Japan .

OTHER PUBLICATIONS

Moustakas et al., "Optical Switching in Metal Tunnel-Insulator N-p+ Silicon Devices," Solid-State and Electron Devices, Jul. 1979, vol. 3, No. 4, pp. 85-93.

Primary Examiner—William Mintel
Attorney, Agent, or Firm—Frishauf, Holtz, Goodman & Woodward

[57] ABSTRACT

A semiconductor device serving as a semiconductor light-emitting element, a semiconductor light-receiving element, or a transistor, includes a first semiconductor layer of a first conductivity type having an ohmic electrode on one surface thereof, a second semiconductor layer of a second conductivity type formed on the other surface of the first semiconductor layer, source and drain regions formed in a surface region of the second semiconductor layer, source and drain electrodes respectively formed on the source and drain regions, an insulating layer formed on the second semiconductor layer between the source and drain regions, and a gate electrode formed on the insulating layer.

7 Claims, 8 Drawing Sheets

SEMICONDUCTOR INSULATED GATE DEVICE WITH FOUR ELECTRODES

BACKGROUND OF THE INVENTION

1. Field of the Invention

The present invention relates to a semiconductor device such as light-emitting and light-receiving elements serving as basic circuit elements in optoelectronics and such as a transistor and, more particularly, to a semiconductor device which can be used as any one of a light-emitting element, a light-receiving element, and a transistor.

2. Description of the Related Art

Figure 1:
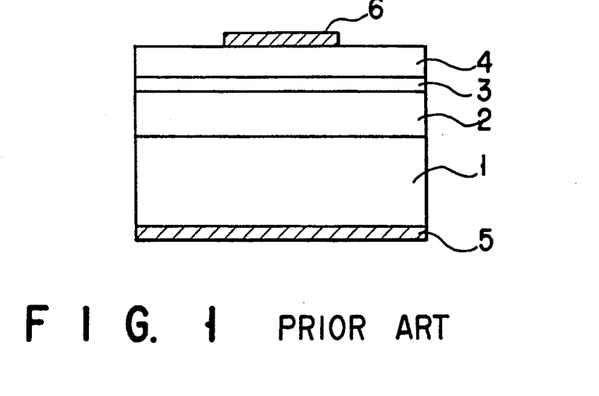
FIG. 1 is a sectional view showing a structure of a double hetero light-emitting element as a typical conventional light-emitting element.

As shown in FIG. 1, a conventional light-emitting element has a structure in which an n- or p-type cladding layer 2, an active layer 3 consisting of undoped GaAs, and a p- or n-type cladding layer 4 are sequentially stacked on an n- or p-type substrate 1, and ohmic electrodes 5 and 6 are formed on both surfaces of the resultant multi-layered structure. That is, the active layer 3 is sandwiched between the two cladding layers 2 and 4. Note that the refractive index of the active layer 3 is larger than that of each of the cladding layers 2 and 4, and that the band gap of each of the cladding layers 2 and 4 is larger than that of the active layer 3.

When a forward bias is applied to the light-emitting element shown in FIG. 1, electrons and holes are injected from the cladding layers 2 and 4 to the active layer 3. The injected electrons and holes are confined in the active layer 3 having a smaller band gap than that of the cladding layer 2 or 4 and are recombined to emit light. The emitted light is confined in the active layer having a larger refractive index than that of the cladding layer 2 o 4 and propagates in a direction perpendicular to the drawing surface. The light emerges from the end face of the element.

Figure 2:
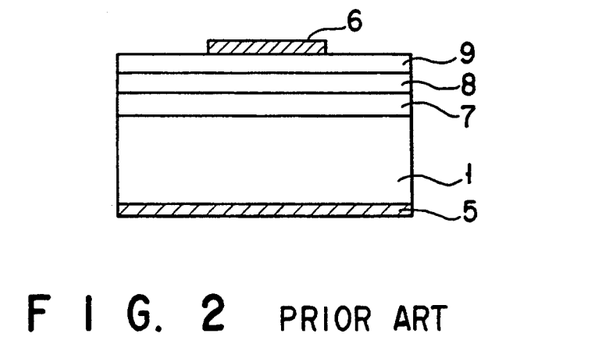
FIG. 2 is a sectional view showing a structure of a pin light-receiving element as a typical conventional light-receiving element.

As shown in FIG. 2, a conventional light-receiving element has a structure in which an n- or p-type epitaxial layer 7, an i-type layer 8 consisting of undoped GaAs, and a p- or n-type epitaxial layer 9 are sequentially stacked on an n- or p-type substrate 1, and ohmic electrodes 5 and 6 are formed on both surfaces of the multi-layered structure. That is, the i-type layer 8 is sandwiched between the two epitaxial layers 7 and 9.

When light having an energy larger than the band gap of the i-type layer 8 of the light-receiving element shown in FIG. 2 is incident on the i-type layer 8, electron-hole pairs are generated in the i-type layer 8 and flow into the epitaxial layers 7 and 9. When the amount of incident light is increased, the number of electron-hole pairs is increased accordingly. A current capable of being extracted across two ends of the light-receiving element is increased. Therefore, since a current corresponding to the amount of incident light flows, optical detection can be performed.

As is apparent from comparison between the light-emitting element shown in FIG. 1 and the light-receiving element shown in FIG. 2, the light-emitting and light-receiving elements have the same basic structure. Therefore, it may be possible to obtain light-emitting and light-receiving elements by using identical elements.

In order to form an inversion distribution in the active layer of the light-emitting element, carriers (electrons and holes) having a concentration of $10^{18}$ cm$^{-3}$ or more must be confined in the active layer. For this purpose, the carrier concentration of the cladding layer serving as a carrier source must be maximized (i.e., $10^{18}$ cm$^{-3}$ or more). At present, however, n-type AlGaAs can have a maximum carrier concentration of about $4 \times 10^{18}$ cm$^{-3}$, and p-type GaAs can have a maximum carrier concentration of about $2 \times 10^{19}$ cm$^{-3}$. In order to assure a high carrier concentration, a high-concentration donor or acceptor impurity must be doped in AlGaAs. When an excessive amount of an impurity is doped in this material, crystal detects and the like occur in AlGaAs, and a high carrier concentration cannot be obtained. Therefore, it is difficult to obtain a higher carrier concentration in the state-of-the-art techniques.

Since carriers injected from the cladding layer having a carrier concentration of $10^{18}$ cm$^{-3}$ to $10^{19}$ cm$^{-3}$ to the active layer have a concentration of $10^{18}$ cm$^{-3}$ to $10^{19}$ cm$^{-3}$ or less, the active layer must be made thin (i.e., the volume of the active layer must be small) to form an inversion distribution. An active layer having a thickness of about 1,000 Å has been frequently used to cope with this.

On the other hand, in the i-type layer (corresponding to the active layer of the light-emitting element) serving as the light-receiving portion of the light-receiving element, the number of electron-hole pairs must be maximum to increase an optical detection sensitivity. When the light-emitting element is directly used as a light-receiving element, the optical detection sensitivity is undesirably decreased because the thickness of the i-type layer is as small as 1,000 Å.

When light-emitting and light-receiving elements are formed on a single substrate in the same process, i.e., when the light-emitting and light-receiving elements are integrally formed, laser oscillation does not occur if the thickness of the active layer (i-type layer) is small. To the contrary, when the thickness of the active or i-type layer is decreased, the reception sensitivity is decreased. As a result, practical light-emitting and light-receiving elements cannot be obtained.

Figure 3:
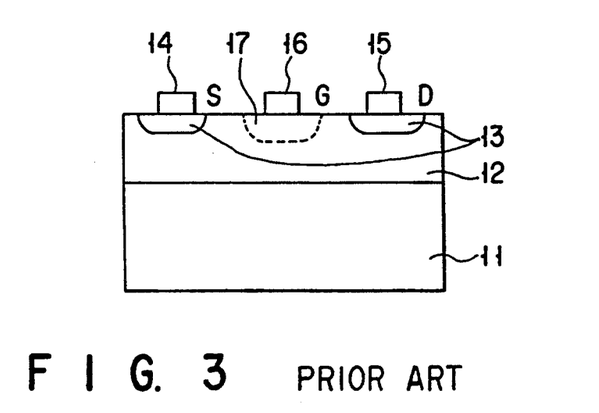
FIG. 3 is a sectional view showing a structure of a typical conventional field effect transistor (FET)

FIG. 3 shows a structure of a typical field effect transistor (FET). Referring to FIG. 3, n+- or p+-type regions 13 are formed in the surface region of an n- or p-type active layer 12 formed on a semi-insulating substrate 11. Source (S) and drain (D) electrodes 14 and 15 are in ohmic contact with the n+- or p+-type regions 13. On the other hand, a gate (G) electrode 16 is in Schottky contact with the n- or p-type active layer 12, and therefore a depletion layer 17 is formed in the active layer 12.

When a gate (G) voltage is changed in a state wherein a current flows from the drain (D) electrode 15 to the source (S) electrode 14, the width of the depletion layer under the gate (G) electrode 16 is changed. Therefore, a current flowing through the drain (D) and the source (S) is changed (modulated or amplified) in accordance with a change in gate (G) voltage.

As is apparent from FIGS. 1 to 3, the structures of the light-emitting and light-receiving elements are basically identical to each other but are entirely different from the transistor structure. For this reason, when an optoelectronic integrated circuit (i.e., a circuit in which an optical element and an electronic element are formed on a single substrate) is to be formed, the respective elements must be manufactured in the corresponding independent processes. In this fabrication process, an already formed element (i.e., the first element or the first and second elements) may be damaged in annealing of the second or third element. In addition, since the fabrication process is undesirably complicated, this process is not suitable for mass production.

SUMMARY OF THE INVENTION

It is an object of the present invention to provide a semiconductor device which can serve both as light-emitting and light-receiving elements and which has a high luminous efficacy and a high sensitivity.

It is another object of the present invention to provide a semiconductor device which can serve as any one of a light-emitting element, a light-receiving element and a transistor.

According to the first aspect of the present invention, there is provided a semiconductor device comprising a semiconductor substrate of a first conductivity type having an ohmic electrode on one surface thereof, a semiconductor active layer of a second conductivity type formed on the other surface of the semiconductor substrate, a tunnel layer formed on the semiconductor active layer, and a gate electrode formed on the tunnel layer.

According to the second aspect of the present invention, there is provided a semiconductor device comprising a first semiconductor layer of a first conductivity type having an ohmic electrode on one surface thereof, a second semiconductor layer of a second conductivity type formed on the other surface of the semiconductor layer, source and drain regions of the second conductivity type formed in a surface region of the second semiconductor layer, source and drain electrodes respectively formed on the source and drain regions, an insulating layer formed on the second semiconductor layer between the source and drain regions, and a gate electrode formed on the insulating layer.

According to the third aspect of the present invention, there is provided a semiconductor device comprising: a semiconductor light-emitting element having a first semiconductor layer of a first conductivity type having an ohmic electrode on one surface thereof, a second semiconductor layer of a second conductivity type formed on the other surface of the semiconductor layer, source and drain regions of the second conductivity type formed in a surface region of the second semiconductor layer, source and drain electrodes respectively formed on the source and drain regions, an insulating layer formed on the second semiconductor layer between the source and drain regions, and a gate electrode formed on the insulating layer; a semiconductor light-receiving element having the same structure as that of the semiconductor light-emitting element; and a transistor having the same structure as those of the semiconductor light-emitting and light-receiving elements, the semiconductor light-emitting element, the semiconductor light-receiving element, and the transistor being formed on a single substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A semiconductor device according to the first aspect of the present invention comprises a semiconductor substrate of a first conductivity type having an electrode on one surface thereof, a semiconductor active layer of a second conductivity type formed on the other surface of the semiconductor substrate, a tunnel layer formed on the semiconductor active layer, and a gate electrode formed on the tunnel layer.

The semiconductor device having the above structure can be used as a light-emitting element. More specifically, upon application of a voltage, carriers are injected from the gate electrode to the active layer by a tunnel phenomenon, and the carriers are injected from a p-n junction constituted by the semiconductor substrate and the active layer to the active layer, thereby emitting light.

The semiconductor device according to the present invention can be used as a light-receiving element.

More specifically, light is caused to become incident near the active layer, and carriers generated by the active layer generate a voltage. In addition, the semiconductor device according to the present invention can serve both as a light-emitting element and a light-receiving element. More specifically, when the semiconductor active layer is set in a low-resistance state, the semiconductor device serves as a light-emitting element. When the semiconductor active layer is set in a high-resistance state, the semiconductor device serves as a light-receiving element.

A semiconductor epitaxial layer of the first conductivity type can be formed between the semiconductor substrate and the semiconductor active layer in the semiconductor device according to the present invention. The active layer can be made of a material having a band gap equal to or smaller than that of the epitaxial layer. The active layer can be made of a material having a refractive index larger than that of the epitaxial layer.

When the gate electrode is made of a transparent low-resistance material, light emission or reception can be performed through the gate electrode. In addition, when the tunnel layer is made of a reflecting film, light can be efficiently confined within the active layer.

The semiconductor light-emitting or light-receiving element according to the present invention has a MISS structure as a combination of a p-n junction (active layer/epitaxial layer) and a MIS structure (gate electrode/tunnel layer/active layer). The light-emitting and light-receiving functions are as follows.

(1) Light-Emitting Function

Figure 4:
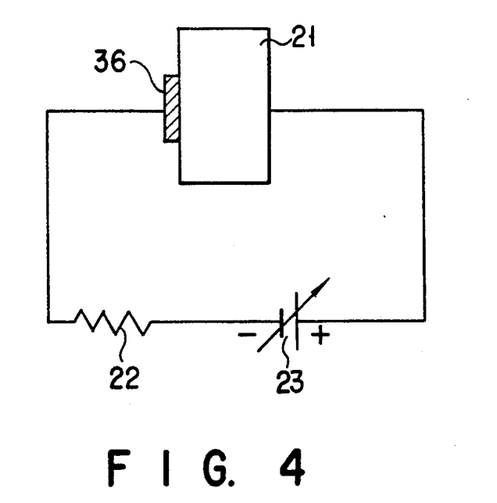
FIG. 4 is a circuit diagram of a driver for driving a MISS (FIG. 9) according to an embodiment of the present invention.

An operation using an n-type active layer/p-type epitaxial layer as an p-n junction structure will be described below. As shown in FIG. 4, a MISS element 21 according to the present invention is connected to a variable voltage source 23 through a protective resistor 22. The polarities of the variable voltage source 23 are selected so that the p-n junction is forward-biased, and the MIS junction is reverse-biased. Note that when the p-n junction structure is constituted by a p-type active layer/n-type epitaxial layer structure, the polarities of the variable voltage source 23 are reversed.

Figure 5:
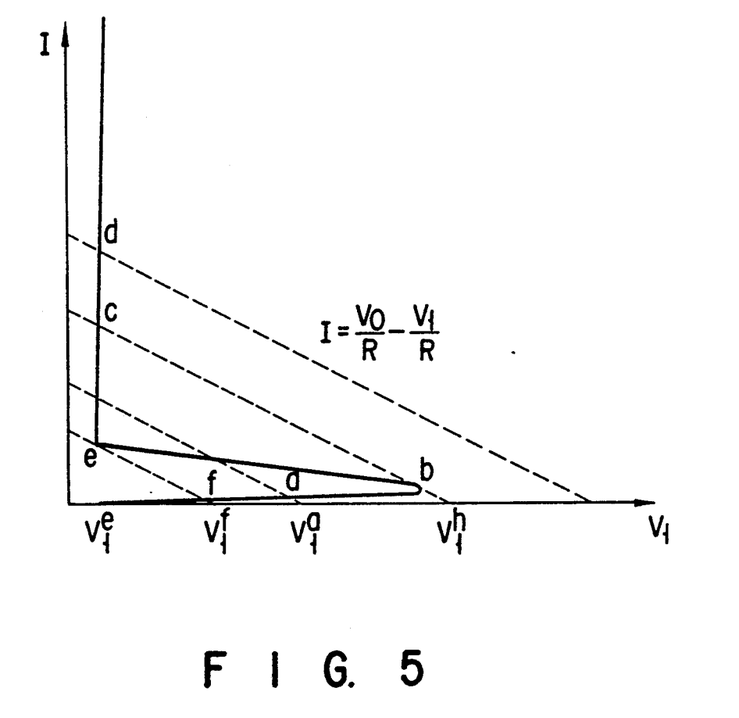
FIG. 5 is a graph showing IV characteristics of the MISS element shown in FIG. 9.
Figure 6:
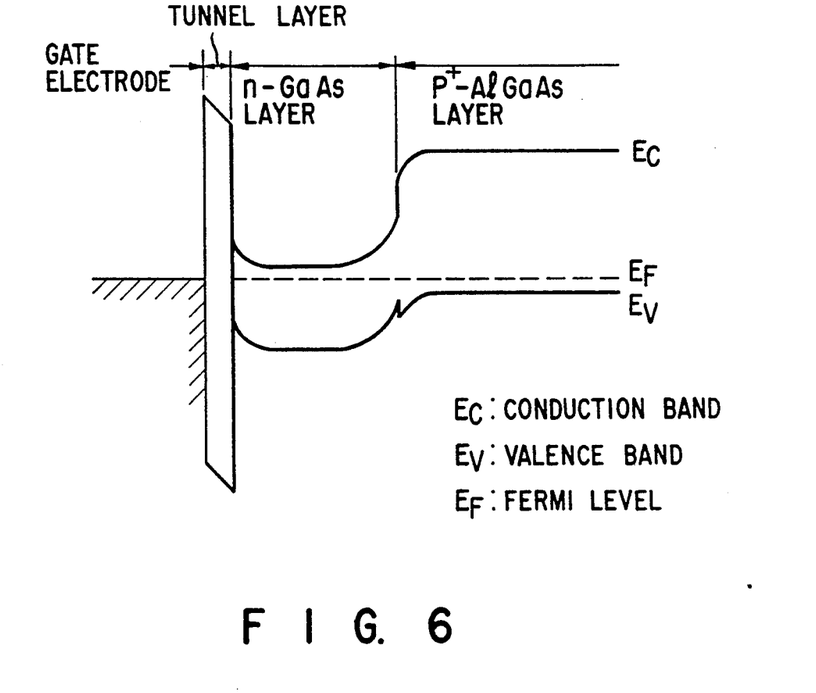
FIG. 6 is an energy band diagram of the MISS element shown in FIG. 9 in a thermal equilibrium state.
Figure 7:
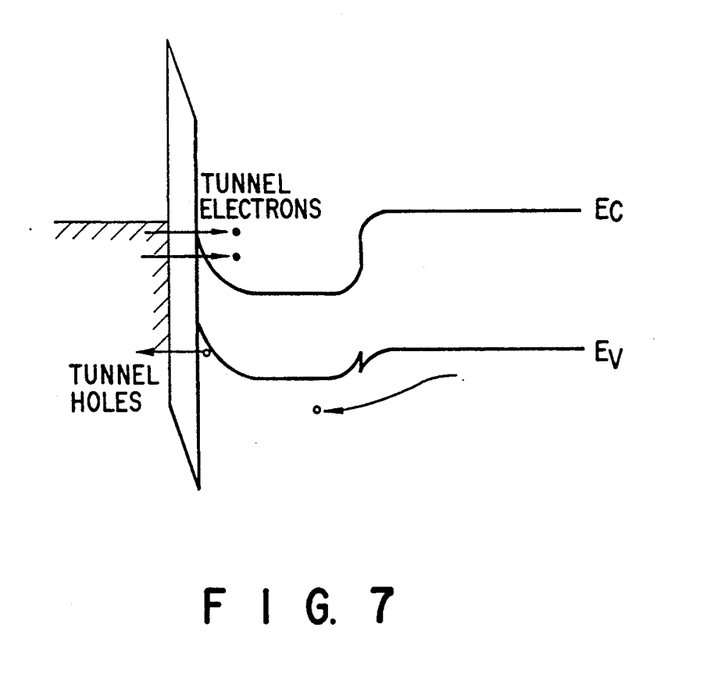
FIG. 7 is an energy band diagram of the MISS element shown in FIG. 9 in an OFF state.

When a voltage is applied to the MISS element 21 and is increased, VI characteristics (switching characteristics) shown in FIG. 5 are obtained. Dotted lines $[I=(V_0/R)-(V_1/R)]$ show load lines. That is, when a voltage is applied to the MISS element 21, holes are injected from the p type epitaxial layer having a hole concentration of about $10^{19}$ cm$^{-3}$ to the n-type active layer (electron concentration: about $10^{16}$ cm$^{-3}$) and are stored at the MIS interface (point a in FIG. 5). When the voltage is further increased, a large number of holes are injected from the p-type epitaxial layer to the n-type active layer, and an inversion layer is formed at the MIS interface. As a result, a high voltage is generated across the tunnel layer, and tunnel electrons are injected from the gate electrode to the n-type active layer. The injected electrons further forward-bias the p-n junction (i.e., positive feedback), and a larger number of holes are injected from the p- type epitaxial layer to the MIS interface (a→b in FIG. 5; FIG. 7). FIG. 6 is an energy band diagram of the MISS element 21 in a thermal equilibrium state, and FIG. 7 is an energy band diagram of the MISS element 21 in an OFF state.

Figure 8:
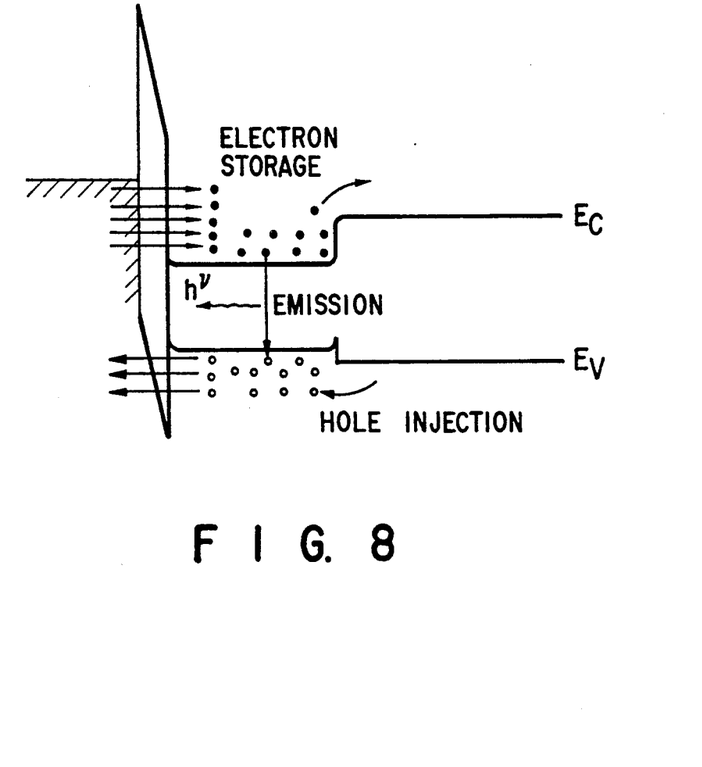
FIG. 8 is an energy band diagram of the MISS element shown in FIG. 9 in an ON state.

When a MISS element voltage $V_1$ exceeds a given threshold value ($V_{1th}$), an operating point is shifted from point b to point c (OFF state ON state), thereby causing a switching phenomenon. In ON states at points c, d, and e, since a large number of electrons (up to $10^{23}$ cm$^{-3}$) are injected from the gate electrode to the n-type active layer by a tunnel phenomenon, an inversion distribution is formed in the n-type active layer, as shown in FIG. 8, thereby causing laser oscillation. In this manner, since a large number of electrons are injected in the active layer, the thickness of the active layer need not be decreased unlike in the conventional light-emitting element.

The light thus emitted is confined between the p-type epitaxial layer having a refractive index smaller than that of the active layer and the gate electrode having a reflectance larger than that of the active layer and emerges in a direction perpendicular to the drawings surface. When the voltage $V_1$ is decreased from point c, the operating point is shifted from point e to point f (ON state OFF state) at $V_1=V_{1f}$, thereby stopping laser oscillation.

(2) Light-Receiving Function

When the two ends of the MISS element are disconnected and light having an energy larger than the band gap of the n-type active layer is caused to become incident on the n-type active layer, holes of the generated electron-hole pairs move toward the MIS and p-n interfaces, while the electrons are concentrated near the central portion of the active layer. Consequently, the MIS junction is reverse-biased, and the p-n junction is forward-biased (e.g., point a in FIG. 5), thereby generating a voltage across the element.

As described above, the MISS element can be used as a light-emitting element in an ON state and a light-receiving element in an OFF state.

The present invention will be described in more detail by way of its examples with reference to the accompanying drawings.

EXAMPLE 1

Figure 9:
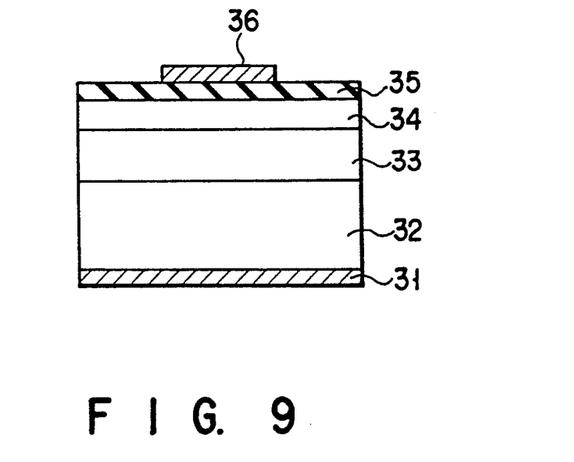
FIG. 9 is a sectional view showing the MISS element according to the embodiment of FIG. 4.

FIG. 9 is a sectional view showing a semiconductor light-emitting/light-receiving element according to an embodiment of the present invention. This semiconductor light emitting/receiving element can be manufactured as follows.

A p-Al$_{0.45}$Ga$_{0.55}$As layer 33 (thickness: about 2 μm; hole concentration: $2\times10^{19}$ cm$^{-3}$) and an n-GaAs active layer 34 (thickness: about 1 μm; electron concentration: $2\times10^{16}$ cm$^{-3}$) were epitaxially grown on a p-GaAs substrate 32 (hole concentration: $2\times10^{19}$ cm$^{-3}$). An ohmic electrode 31 (Au-Zn alloy) for the p-GaAs substrate 32 was formed, and an SiO$_2$ film having a thickness of 100 Å was formed on the n-GaAs active layer 34 by sputtering, thereby forming a tunnel film 35. Ag was evaporated on the tunnel film 35 to form a gate electrode 36 having a size of 50 μm×500 μm.

An element 21 having a MISS structure thus manufactured was connected in series with a 1-kΩ protective resistor 22, and a bias was applied such that the polarity of the gate electrode 36 was negative and the polarity of the ohmic electrode 31 was positive, as shown in FIG. 4. A switching voltage ($V_{1th}$) serving as an emission threshold value was about 5 V, and a current flowing in an ON state was as small as about 1 mA. It was confirmed that the oscillation frequency was about 870 nm at room temperature. A voltmeter was connected to the two surfaces of the element, and an Ar laser beam (5,145 Å) having a power of about 1 mW/cm$^2$ was radiated on the active layer. A maximum voltage of 1 V was generated across the element.

As described above, the element of Example 1 was confirmed to exhibit both the light-emitting and light-receiving functions.

EXAMPLE 2

An element was manufactured following the same procedures as in Example 1 except that a transparent electrode consisting of $SnO_2$ was used as a gate electrode 36. It was found that the element could receive light from the gate electrode 36.

EXAMPLE 3

An element was manufactured following the same procedures as in Example 1 except that an $SiO_2/TiO_2$ multi-layered film was used as a tunnel film 35. It was found that the switching voltage ($V_1$th) was increased to about 10 V and the emission intensity was also increased.

When an Ar laser beam having a power of about 1 $mW/cm^2$ was radiated on the element, a maximum voltage of about 2 V was obtained.

In each of the above examples, the $SiO_2$ film or the $SiO_2/TiO_2$ multi-layered film was used as the tunnel film. However, the tunnel film is not limited to this, and an organic thin film may be used to obtain the same effect as described above.

As described above, since the semiconductor device according to the first aspect of the present invention has a MISS structure as a combination of a p-n junction and a MIS structure, a large number of carriers from the electrode can be injected by a tunnel phenomenon. The thickness of the active layer can be increased, so that the semiconductor device can serve as the light-receiving element in addition to the light-emitting element.

The second aspect of the present invention will be described below.

In a semiconductor device according to the second aspect of the present invention, a second semiconductor layer of a second conductivity type is formed on a first semiconductor layer of a first conductivity type having an ohmic electrode on one surface thereof. A pair of doped regions of the second conductivity type having an impurity concentration higher than that of the second semiconductor layer are formed in a surface region of the second semiconductor layer to be spaced apart from each other. Source and drain electrodes are respectively formed on these doped regions. An insulating film is formed on the surface of the second semiconductor layer, and a gate electrode is formed on the insulating film.

An embodiment according to the second aspect of the present invention will be described below.

Figure 10:
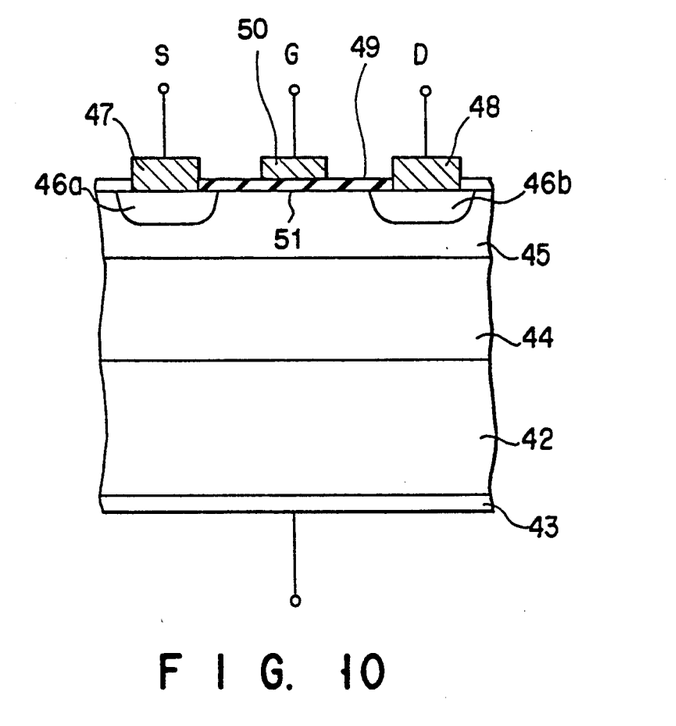
FIG. 10 is a sectional view of a semiconductor device according to another embodiment of the present invention.

FIG. 10 is a sectional view showing the structure of the semiconductor device according to the second aspect of the present invention. Referring to FIG. 10, an ohmic electrode 43 is formed on the lower surface of a $p^+$- or $n^+$-type semiconductor substrate 42, and a $p^+$-or $n^+$-type semiconductor layer 44 is formed on the semiconductor substrate 42. An n- or p-type semiconductor layer 45 is formed on the $p^+$- or $n^+$-type semiconductor layer 44. $N^+$- or $p^+$-type impurity doped regions 46a and 46b are formed in the surface region of the semiconductor layer 45. Source and drain electrodes 47 and 48 as ohmic electrodes are respectively formed on these impurity doped regions 46a and 46b. A tunnel film 49 is formed on the semiconductor layer 45.

A gate electrode 50 is formed on the tunnel film 49 between the source and drain electrodes 47 and 48. Reference numeral 51 denotes a MIS interface as an interface between the p-type semiconductor layer 45 and the tunnel film 49.

The semiconductor device shown in FIG. 10 has an element structure in which the impurity doped regions and the ohmic electrodes are added to a MISS structure as a combination of a p-n junction and a MIS structure.

Functions of light-emitting, light-receiving, and transistor portions will be described below. For the sake of descriptive convenience, the semiconductor substrate 42 and the semiconductor layer 44 are assumed to be of p-type, and the semiconductor layer 45 and the impurity doped regions 46a and 46b are assumed to be of n-type. When the conductivity types of the respective layers are reversed, the polarities of the application voltages in the following description must be reversed accordingly.

The light-emitting function will be described with reference to FIGS. 10 and 11.

Figure 11:
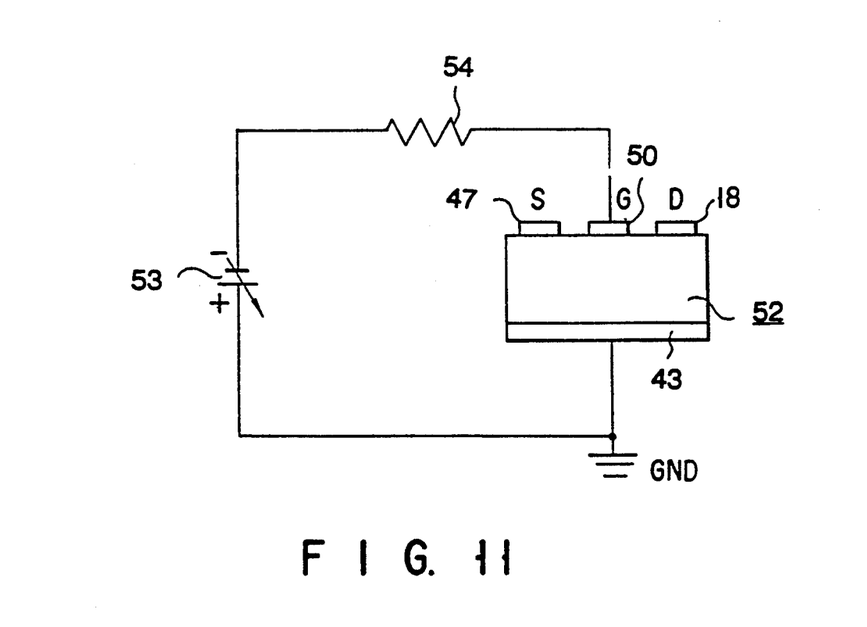
FIG. 11 is a view showing a wiring pattern when the semiconductor device shown in FIG. 10 is used as a light-emitting element.

FIG. 11 shows a view showing a wiring pattern when a semiconductor device 52 shown in FIG. 10 is used as a light-emitting element. A variable power source 53 and a protective resistor 54 are connected between the ohmic electrode 43 and the gate electrode 50 of the semiconductor device 52, and the ohmic electrode 43 is grounded.

In this wiring state, when a voltage is applied to the semiconductor device, holes are injected from the $p^+$-type semiconductor layer 44 to the n-type semiconductor layer 45 and are stored at the MIS interface 51. When the voltage is increased, a larger number of holes are injected to the MIS interface 51, and then an inversion layer is formed at the MIS interface 51. A high voltage is generated across the tunnel film 49, and tunnel electrons are injected from the gate electrode 50 to the n-type semiconductor layer 45. The injected tunnel electrons further forward-bias the p-n junction (positive feedback). Therefore, a larger number of holes are injected from the $p^+$-type semiconductor layer 44 to the n-type semiconductor layer 45.

When a voltage across the element exceeds a predetermined threshold voltage, the state of the element is changed from a high-resistance state to a low-resistance state, i.e., switching occurs. For this reason, a large number of electrons are injected from the gate electrode 50 to the n-type semiconductor layer 45, thus causing light emission. The light thus emitted is confined between the $p^+$-type semiconductor layer 44 having a refractive index smaller than that of the n-type semiconductor layer 45 and the tunnel film 49 or the metal gate electrode 50 having a reflectance larger than that of the n type semiconductor layer 45. The light then emerges in a direction perpendicular to the drawing surface in FIG. 11.

A light-receiving function will be described with reference to FIGS. 10, 12, and 13.

When the semiconductor device 52 shown in FIG. 10 is used as a light-receiving element, a voltage mode for generating an output voltage or a current mode for generating an output current can be set. The voltage mode will be described first.

Figure 12:
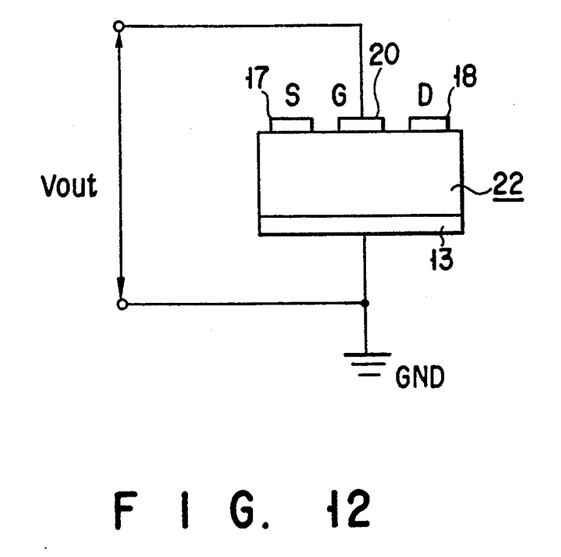
FIG. 12. is a view showing a wiring pattern when the semiconductor device shown in FIG. 10 is used as a light-receiving element.
Figure 13:
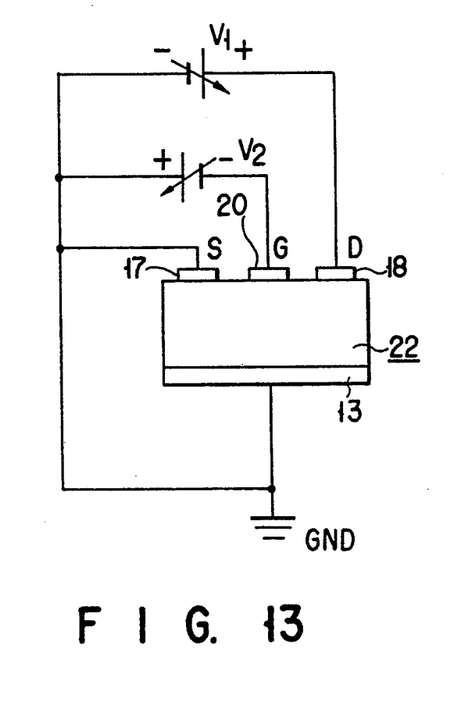
FIG. 13 is a view showing a wiring pattern when the semiconductor device shown in FIG. 10 is used as a light-receiving element in a current mode and when this semiconductor device is used as a field effect transistor (FET)

The semiconductor device 52 is wired, as shown in FIG. 12. When light having an energy larger than the band gap of the n-type semiconductor layer 45 is incident on the MIS interface 51 and the n-type semiconductor layer 45, holes of the generated electron-hole pairs move toward the MIS interface 51 and the p+-type semiconductor layer 44, while the electrons stay in the n-type semiconductor layer 45. In this state, the MIS junction is reverse-biased, and the p-n junction is forward-biased. A voltage is generated across the semiconductor device 52. The magnitude of the voltage depends on the number of electron-hole pairs, i.e., the intensity of incident light. Therefore, an optical signal can be extracted as a voltage across the semiconductor device 52.

The current mode will be described below. In the current mode, the semiconductor device is wired, as shown in FIG. 13. When light having an energy larger than that of the band gap of the n-type semiconductor layer 45 is incident on the MIS interface 51 and the n-type semiconductor layer 45, holes of the generated electron-hole pairs move toward the MIS interface 51 and the p+-type semiconductor layer 44. The holes moved to the MIS interface 51 form an inversion or depletion layer therein. For this reason, a potential barrier between the source (S) and the drain (D) for electrons is lowered, and a current flows between the source (S) and the drain (D). The magnitude of this current depends on the number of holes stored in the MIS interface 51 and used to change the potential barrier between the source (S) and the drain (D) for electrons, i.e., depends on the intensity of incident light. Therefore, an optical signal can be extracted as a current between the source (S) and the drain (D). Note that the principle of operation in the current mode is the same as a CMD (Charge Modulation Device).

An operation of the semiconductor device serving as a transistor (FET) will be described with reference to FIGS. 10 and 13. In this case, the same wiring as in the current mode of the light-receiving function is performed.

When a negative voltage $V_2$ is applied to the gate electrode 50, a depletion layer having a width corresponding to the magnitude of the voltage $V_2$ is formed. This depletion layer serves as a barrier for electrons, and a current flows between the source (S) and the drain (D) in accordance with the width of the formed depletion layer. A current flows between the source (S) and the drain (D) in correspondence with a change in gate voltage $V_2$. When a voltage signal is applied to the gate electrode 50, an output (current) signal can be extracted from the source (S)-drain (D) path.

A fabrication process of the semiconductor device shown in FIG. 10 will be described in detail with reference to FIGS. 14A to 14D and 15.

Figure 14A:
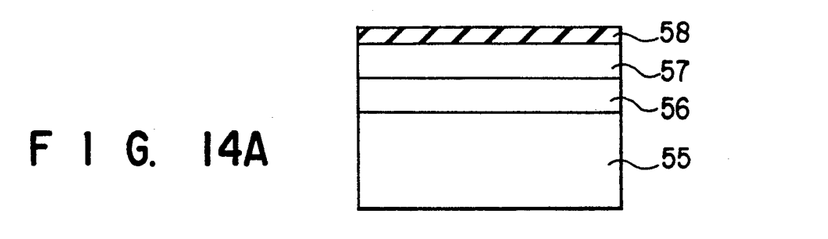
FIGS. 14A to 14D are sectional views showing the fabrication process of the semiconductor device shown in FIG. 10.

As shown in FIG. 14A, a p+-Al$_{0.3}$Ga$_{0.7}$As layer (thickness: about 2 μm; hole concentration: $2 \times 10^{19}$ cm$^{-3}$) 56 and an n-GaAs layer (thickness: about 1 μm; electron concentration: $2 \times 10^{16}$ cm$^{-3}$) 57 were grown on a p+-GaAs (hole concentration: $2 \times 10^{19}$ cm$^{-3}$) substrate 55 by MOCVD. An SiO$_2$ film having a thickness of about 100 Å was formed on the n-GaAs layer 57 by sputtering, thereby obtaining a tunnel film 58.

Figure 14B:
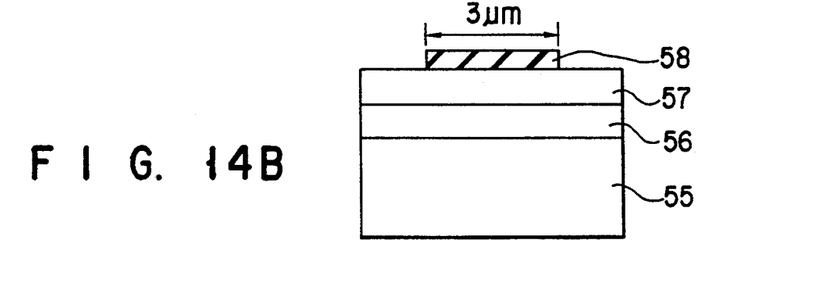

As shown in FIG. 14B, the SiO$_2$ film 58 was etched into a stripe (width: 3 μm) by lithographic techniques.

Figure 14C:
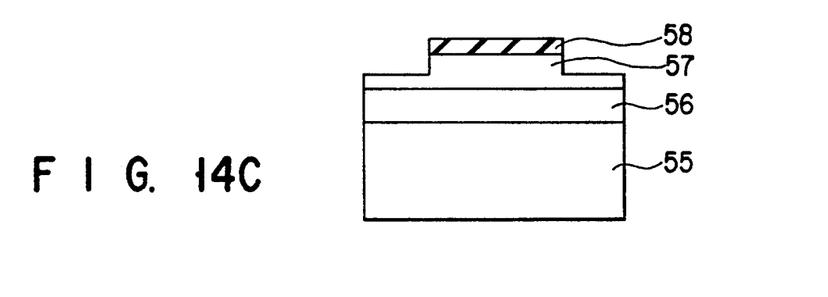

As shown in FIG. 14C, the n-GaAs layer 57 was etched by about 1 fm using the stripe-like SiO$_2$ tunnel film 58 as an etching mask.

Figure 14D:
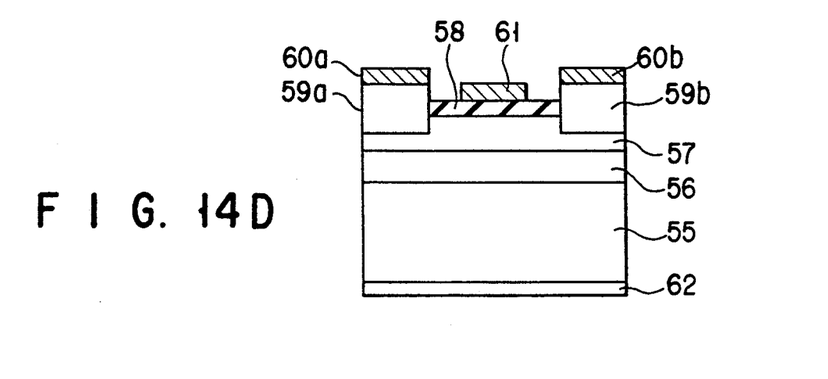

As shown in FIG. 14D, using selective growth techniques, n+-Al$_{0.3}$Ga$_{0.7}$As regions (thickness: about 2 μm; electron concentration: $2 \times 10^{18}$ cm$^{-3}$) 59a and 59b were grown on a portion from which the n-GaAs layer 57 was partially etched. At this time, the stripe-like SiO$_2$ tunnel film 58 served as a mask for selective growth.

Au/Sn ohmic electrodes 60a and 60b respectively serving as source and drain electrodes were formed on the n+-Al$_{0.3}$Ga$_{0.7}$As regions 59a and 59b. An Au/Sn Schottky electrode 61 serving as a gate electrode was formed on the SiO$_2$ tunnel film 58. An Au/Zn ohmic electrode 62 was formed on the lower surface of the p+-GaAs substrate 55.

Figure 15:
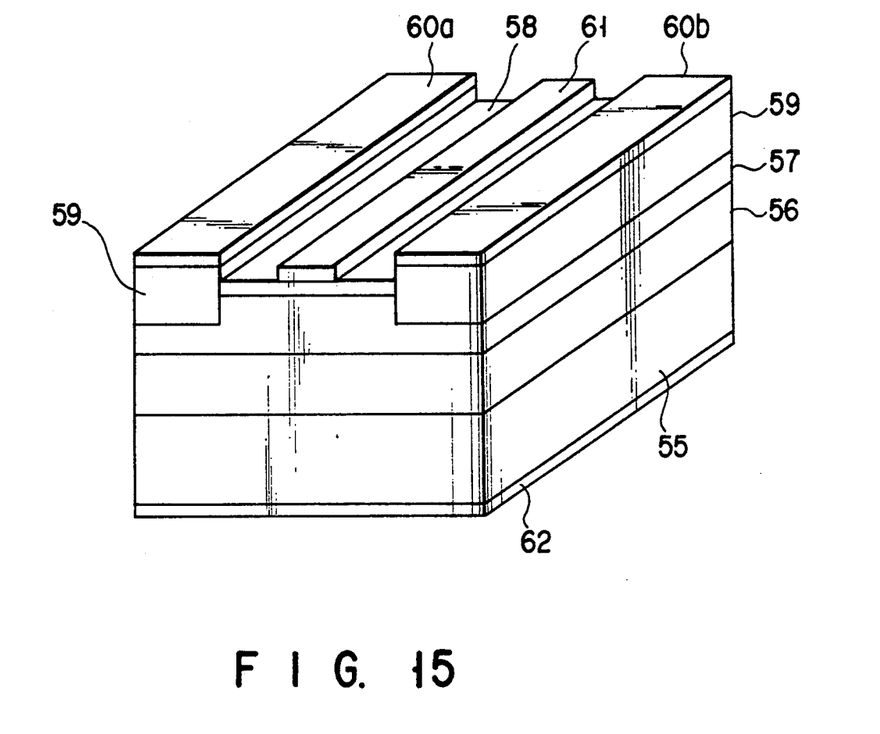
FIG. 15 is a perspective view of the semiconductor device manufactured in the fabrication process of FIGS. 14A to 14D.

The outer appearance of the semiconductor device having the MISS structure manufactured in the above fabrication process is shown in FIG. 15.

An 1-kΩ protective resistor was connected in series with the semiconductor device, as shown in FIG. 11, and a negative voltage was applied to the gate electrode. Switching occurred at a gate voltage of about −5V, and light emission occurred at an emission wavelength of about 870 nm (room temperature).

A voltmeter was connected across two ends of the semiconductor device, and an Ar laser beam (5,145 Å) having a power of about 1 mW/cm² was radiated on the MIS interface from the side surface of the element. A voltage of about 1 V was generated across the element. The semiconductor device was wired, as shown in FIG. 13 ($V_1 = 10$ V and $V_2 = 1$ V), and a similar Ar laser beam was radiated on the element. An increase in current of about 7 mA across the source (S) and the drain (D) was observed. When the semiconductor device was wired, as shown in FIG. 13 ($V_1 = 10$ V), and the voltage $V_2$ was changed in the range of 0 to 5 V, a current flowing across the source (S) and the drain (D) was changed in the range of 0 to 25 mA.

It was confirmed that the semiconductor device had light-emitting and light-receiving functions and a transistor function.

The semiconductor device described above can therefore be used as a light-emitting element, a light-receiving element, or a transistor in accordance with different voltage application schemes.

As described above, since the semiconductor devices having identical structures according to the second aspect of the present invention can be used as a light-emitting element, a light-receiving element, and a transistor, a plurality of elements having the same structure can be formed on a single substrate and can be used as an optical integrated circuit. An optical pickup apparatus as an application example will be described with reference to FIG. 16.

Figure 16:
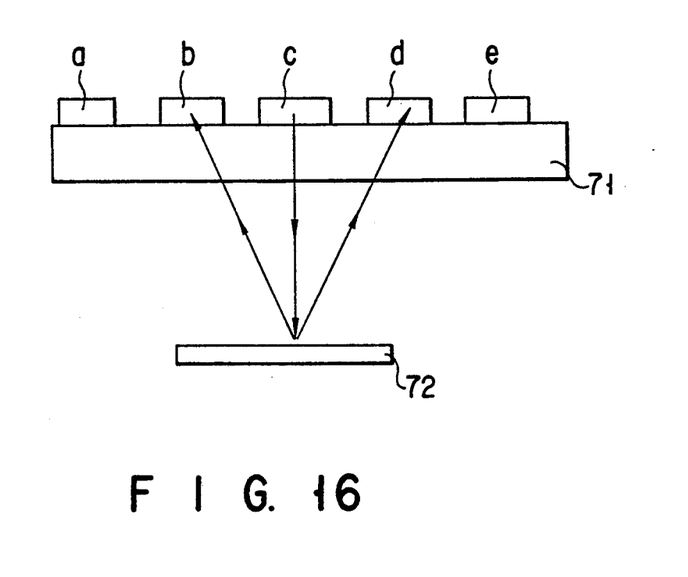
FIG. 16 is a sectional view showing an optical pickup apparatus in which a plurality of semiconductors (FIG. 10) are arranged on a single substrate.

In the optical pickup apparatus shown in FIG. 16, five semiconductor elements a to e are formed on a substrate 71. The semiconductor element c is a light-emitting element, the semiconductor elements b and d are light-receiving elements, and the semiconductor elements a and e are FETs for amplifying light-reception signals from the light-receiving elements b and d. Light from the light-emitting element c is reflected by a reflecting surface of an optical disk 72, and the reflected light is received by the light-receiving elements b and d. Light-receiving signals from the light-receiving elements b and d are amplified by the FETs a and e, respectively.

In the optical pickup apparatus shown in FIG. 16, since the semiconductor elements a to e have the same structure, a plurality of semiconductor elements having the same structure are simultaneously manufactured and are wired to obtain the above function. Light-emitting, light-receiving, and amplification elements which are required in the optical pickup can be simultaneously manufactured on a mass production line. Since the optical pickup apparatus shown in FIG. 16 can be constituted by elements having the same structure, the elements can be easily integrated.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept a defined by the appended claims and their equivalents.

What is claimed is:

1. A semiconductor device comprising:
   a first semiconductor layer of a first conductivity type having an ohmic electrode on one surface thereof,
   a second semiconductor layer of a second conductivity type formed on another surface of said semiconductor layer,
   source and drain regions of the second conductivity type formed in a surface region of said second semiconductor layer,
   source and drain electrodes respectively formed on said source and drain regions,
   an insulating layer formed on said second semiconductor layer between said source and drain regions, and
   a gate electrode formed on said insulating layer.

2. A device according to claim 1, wherein said semiconductor device is a semiconductor light-emitting element.

3. A device according to claim 1, wherein said semiconductor device is a semiconductor light-receiving element.

4. A device according to claim 1, wherein said semiconductor device is a transistor.

5. A device according to claim 1, wherein said semiconductor device is a light-emitting/light-receiving/-transistor element.

6. A semiconductor device comprising:
   a semiconductor light-emitting element including a first semiconductor layer of a first conductivity type having an ohmic electrode on one surface thereof, a second semiconductor layer of a second conductivity type formed on another surface of said semiconductor layer, source and drain regions of the second conductivity type formed in a surface region of said second semiconductor layer, source and drain electrodes respectively formed on said source and drain regions, an insulating layer formed on said second semiconductor layer between said source and drain regions, and a gate electrode formed on said insulating layer;
   a semiconductor light-receiving element having the same structure as that of said semiconductor light emitting element; and
   a transistor having the same structure as those of said semiconductor light-emitting and light-receiving elements, and wherein said semiconductor light-emitting element, said semiconductor light-receiving element, and said transistor are formed on a single substrate.

7. A device according to claim 6, wherein said transistor is an amplification element for amplifying a signal from said semiconductor light-receiving element.

* * * * *